United States Patent
Basker et al.

(10) Patent No.: US 9,196,612 B2
(45) Date of Patent: Nov. 24, 2015

(54) SEMICONDUCTOR DEVICE INCLUDING MERGED-UNMERGED WORK FUNCTION METAL AND VARIABLE FIN PITCH

(71) Applicant: International Business Machines Corporation, Armonk, NY (US)

(72) Inventors: Veeraraghavan S. Basker, Schenectady, NY (US); Zuoguang Liu, Schenectady, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 57 days.

(21) Appl. No.: 14/225,812

(22) Filed: Mar. 26, 2014

(65) Prior Publication Data

US 2015/0279839 A1  Oct. 1, 2015

(51) Int. Cl.
| | |
|---|---|
| H01L 27/088 | (2006.01) |
| H01L 21/8234 | (2006.01) |
| H01L 29/423 | (2006.01) |
| H01L 27/02 | (2006.01) |
| H01L 29/66 | (2006.01) |
| H01L 29/78 | (2006.01) |

(52) U.S. Cl.
CPC .... *H01L 27/0883* (2013.01); *H01L 21/823431* (2013.01); *H01L 21/823456* (2013.01); *H01L 27/0207* (2013.01); *H01L 27/0886* (2013.01); *H01L 29/66795* (2013.01); *H01L 29/7856* (2013.01)

(58) Field of Classification Search
CPC .......................... H01L 29/7855; H01L 29/7856
See application file for complete search history.

(56) References Cited

U.S. PATENT DOCUMENTS

| | | | |
|---|---|---|---|
| 6,492,212 B1 | 12/2002 | Ieong et al. | |
| 7,315,994 B2 | 1/2008 | Aller et al. | |
| 7,323,375 B2 * | 1/2008 | Yoon et al. | 438/164 |
| 7,470,570 B2 | 12/2008 | Beintner et al. | |
| 7,745,270 B2 | 6/2010 | Shah et al. | |
| 7,763,531 B2 | 7/2010 | Abadeer et al. | |
| 7,829,951 B2 | 11/2010 | Song et al. | |
| 8,513,131 B2 * | 8/2013 | Cai et al. | 438/696 |
| 8,669,186 B2 * | 3/2014 | LiCausi | 438/696 |
| 8,912,056 B2 * | 12/2014 | Basker et al. | 438/154 |
| 2013/0062702 A1 | 3/2013 | Cheng et al. | |
| 2013/0154019 A1 | 6/2013 | Ando et al. | |
| 2014/0051247 A1 * | 2/2014 | Cheng et al. | 438/689 |
| 2014/0065811 A1 * | 3/2014 | Park et al. | 438/592 |
| 2015/0091100 A1 * | 4/2015 | Xie et al. | 257/401 |

OTHER PUBLICATIONS

Hussain et al., "Dual work function high-k/metal gate CMOS finFETs," 37th European Solid State Device Research Conference, ESSDERC, 2007, pp. 207-209.

Matsukawa et al., "Dual metal gate FinFET integration by Ta/Mo diffusion technology for Vt reduction and multi-Vt CMOS application," 38th European Solid-State Device Research Conference, ESSDERC, 2008, pp. 282-285.

* cited by examiner

*Primary Examiner* — Stephen W Smoot
(74) *Attorney, Agent, or Firm* — Cantor Colburn LLP; Vazken Alexanian

(57) ABSTRACT

A semiconductor device includes a plurality of first semiconductor fins formed on a semiconductor substrate to define first fin trenches. At least one second semiconductor fin is formed on the semiconductor substrate to define second fin trenches. A first work function metal layer is formed in the first and second fin trenches. The first work function metal layer formed in the second trenches has a first cavity formed therein such that the at least one second semiconductor fin realizes a different concentration of the first work function metal layer with respect to the plurality of first semiconductor fins.

20 Claims, 7 Drawing Sheets

SEMICONDUCTOR DEVICE INCLUDING MERGED-UNMERGED WORK FUNCTION METAL AND VARIABLE FIN PITCH

BACKGROUND

The present invention relates to semiconductor devices, and more specifically, to a semiconductor device including work function metal layers to control threshold voltages.

As trends to increase semiconductor device scaling continue, conventional semiconductor devices have relied on multiple work function metal (WFM) layers to achieve threshold voltage variation. However, conventional fabrication processes for providing increased scaled semiconductor devices that include multiple WFM layers have proven to be complicated and difficult. For example, increased fabrication processes are required as the number of WFM layers increase. In addition, residual work function metal removal processes can alter the threshold voltage provided by the WFM layer.

SUMMARY

According to at least one embodiment, a semiconductor device comprises a plurality of first semiconductor fins formed on a semiconductor substrate to define first fin trenches. At least one second semiconductor fin is formed on the semiconductor substrate to define second fin trenches. A first work function metal layer is formed in the first and second fin trenches. The first work function metal layer formed in the second trenches has a first cavity formed therein such that the at least one second semiconductor fin realizes a different concentration of the first work function metal layer with respect to the plurality of first semiconductor fins.

According to another exemplary embodiment, a semiconductor device comprises a plurality of first semiconductor fins formed on a semiconductor substrate. The first semiconductor fins are separated from one another by a first fin pitch that defines first fin trenches having a first width. At least one second semiconductor fin is formed on the semiconductor substrate and is separated from the plurality of first semiconductor fins according to a second fin pitch that defines a second fin trench. The second fin trench has a second width that is greater than the first width of the first trenches. A first work function metal layer is formed in the first and second fin trenches. A second work function metal layer is formed on the first work function metal layer to define a first combination of first and second work function metal layers surrounding the plurality of first semiconductor fins and a second combination of first and second work function metal layers surrounding the at least one second semiconductor fin. The first combination of first and second work function metal layers defines a first threshold voltage and the second combination of first and second work function metal layers defines a second threshold voltage that is different from the first threshold voltage.

According to still another exemplary embodiment, a method of fabricating a semiconductor device comprises forming a plurality of first semiconductor fins on a semiconductor substrate. The first semiconductor fins are separated from one another according to a first fin pitch that defines corresponding first fin trenches having a first width. The method further includes forming at least one second semiconductor fin formed on the semiconductor substrate. The at least one second semiconductor fin is separated from the plurality of first semiconductor fins according to a second fin pitch. The second fin pitch defines corresponding second fin trenches having a second width that is different from the first width. The method further comprises forming a first work function metal layer in the first and second fin trenches. The first work function metal layer formed in the second trenches has a first cavity formed therein such that the at least one second semiconductor fin realizes a different concentration of the first work function metal layer with respect to the plurality of first semiconductor fins.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

Figure 1:
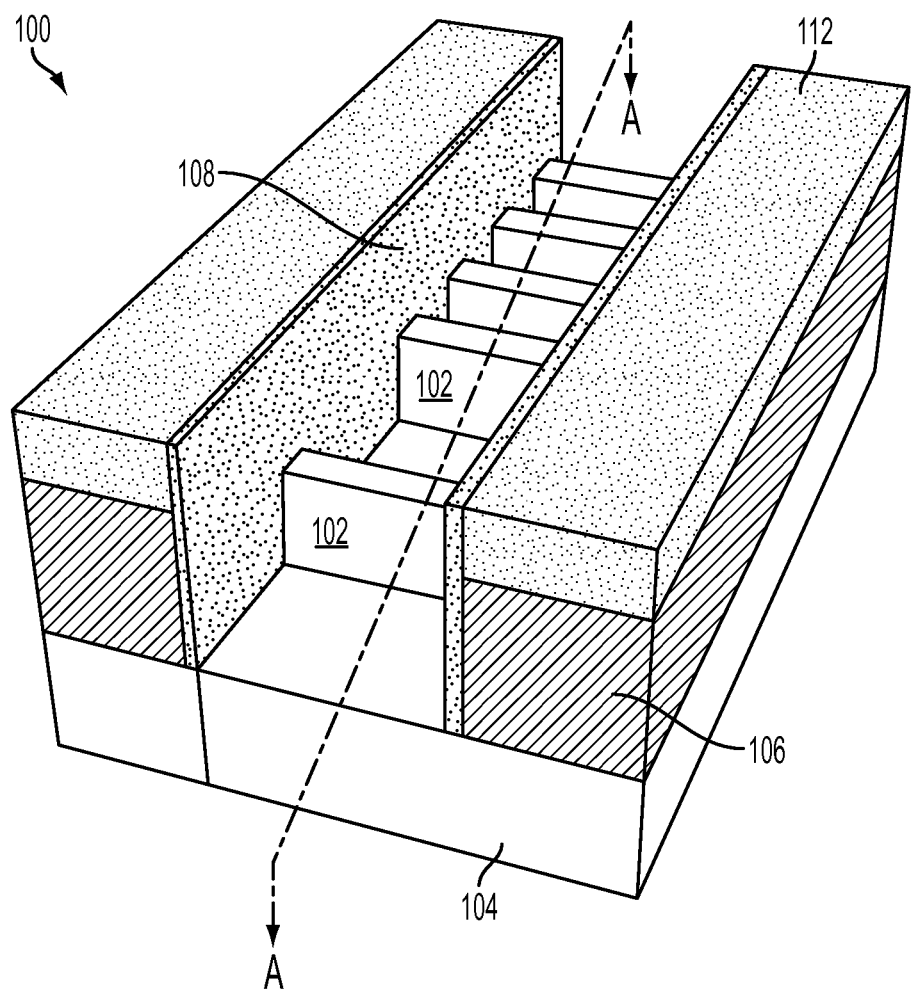
FIG. 1 is a semiconductor device according to a first orientation following removal of a dummy gate stack to show a plurality of semiconductor fins having a varying fin pitch.
Figure 2:
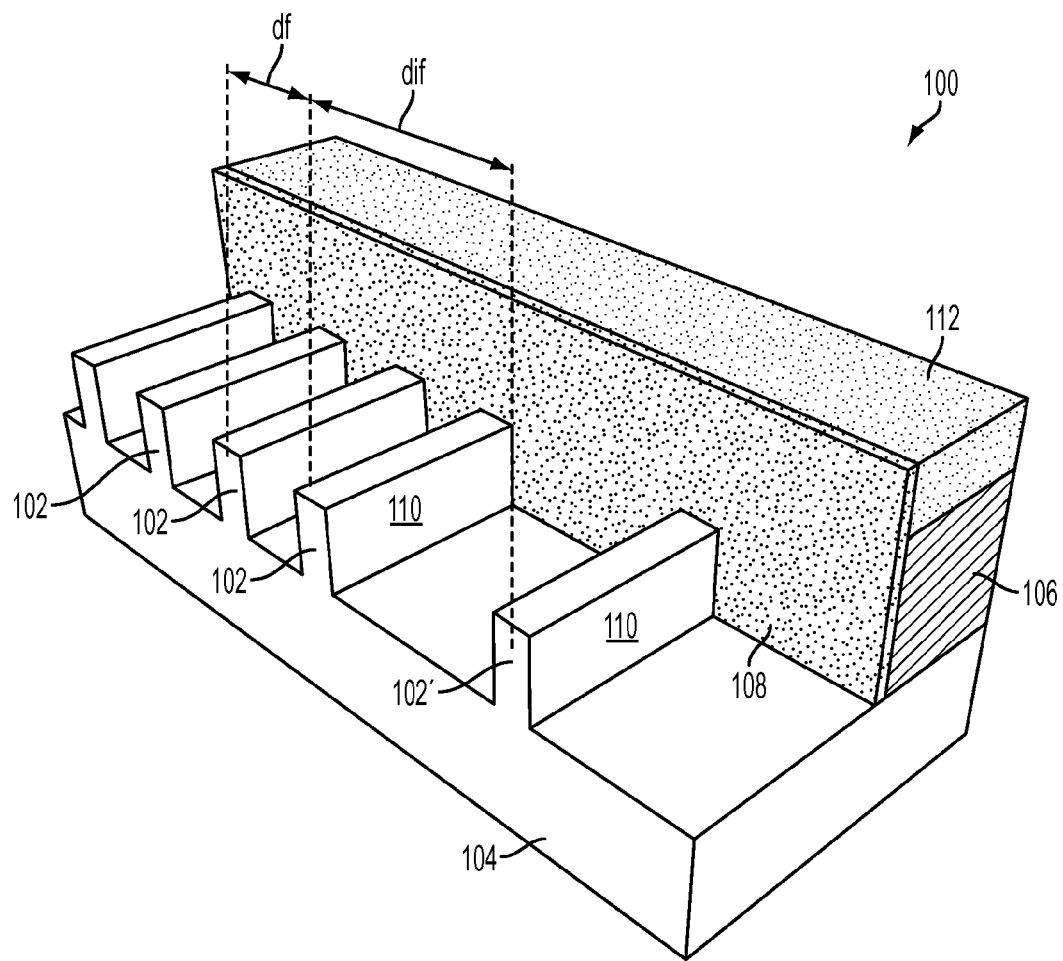
FIG. 2 illustrates the semiconductor device of FIG. 1 according to a second orientation showing a cross-sectional view taken along the line A-A.

With reference now to FIGS. 1 and 2, a variable fin pitch semiconductor device 100 is illustrated according to an exemplary embodiment. Although the semiconductor device is illustrated following removal of a dummy gate stack, it is appreciated that the inventive teachings described herein are not limited to a replacement metal gate (RMG) process. The semiconductor device 100 includes a plurality of semiconductor fins 102 formed on a surface of a semiconductor substrate 104. The semiconductor fins 102 and the semiconductor substrate may be formed from, for example, silicon (Si). Various methods for forming the semiconductor fins 102 may be used as understood by those ordinarily skilled in the art. At least one isolated semiconductor fin 102' has a fin pitch ($d_{if}$) that is different from the fin pitch ($d_f$) of the remaining semiconductor fins 102. According to at least one exemplary embodiment, the at least one isolated semiconductor fin 102' has a fin pitch that is greater than the fin pitch ($d_f$) of the remaining semiconductor fins 102. It is appreciated, however, that the isolated semiconductor fin 102' may have a fin pitch ($d_{if}$) that is less than the fin pitch ($d_f$) of the remaining semiconductor fins 102.

The semiconductor device may further include opposing source/drain (S/D) elements 106 and spacers 108. The S/D elements 106 may be formed at opposite ends of each semiconductor fin 102/102'. The opposing S/D elements 106 define a gate channel region 110 therebetween. According to at least one exemplary embodiment, the S/D elements 106 are epitaxially grown from a semiconductor substrate 104 and surround the semiconductor fins 102/102' as understood by those ordinarily skilled in the art. An oxide masking layer 112 may be formed on an upper surface of each S/D element 106 to maintain the integrity of the material used to form the S/D elements 106. The spacers 108 are formed on sidewalls of the S/D elements 106 and the oxide masking layer 112 according to various methods understood by those ordinarily skilled in the art. Accordingly, the gate channel region 110 may be isolated from the S/D elements 106 and the oxide masking layer 112.

Figure 3:
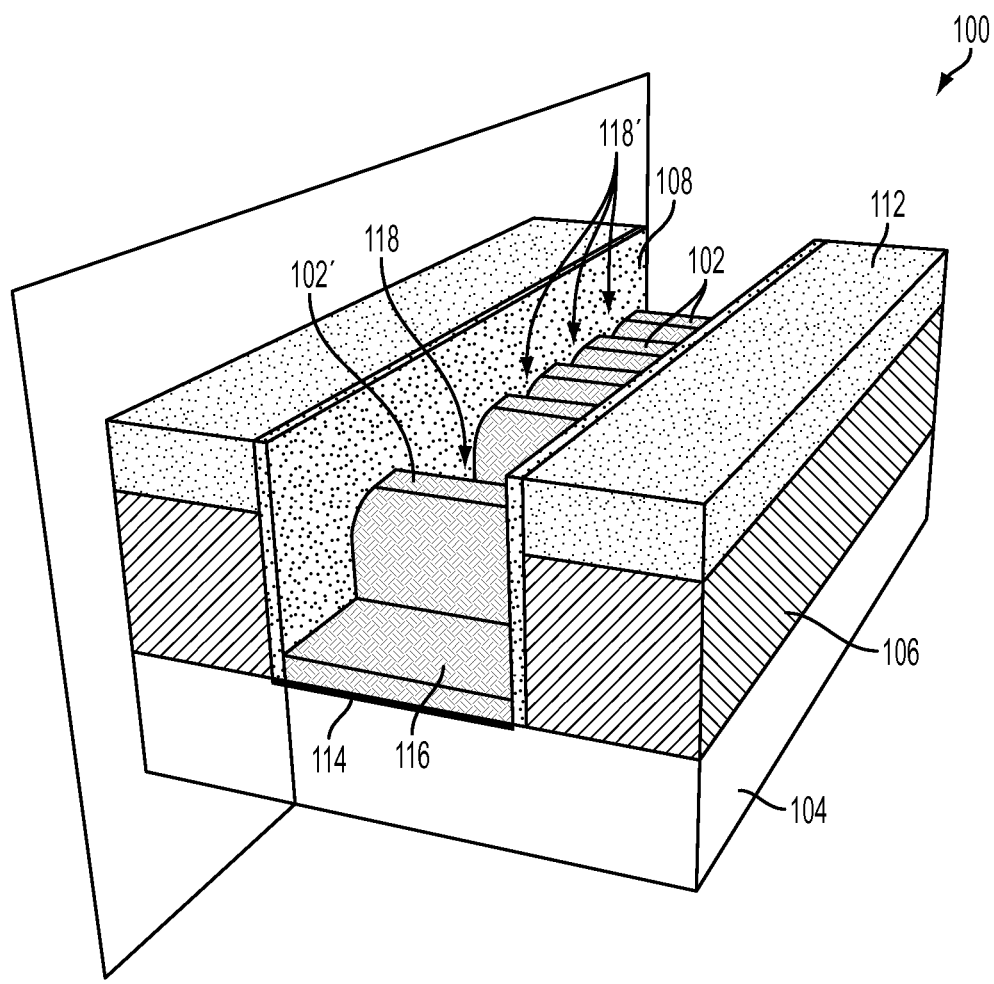
FIG. 3 illustrates the semiconductor device of FIGS. 1 and 2 according to the first orientation following deposition of a dielectric layer on exposed surfaces of the fin and exposed surfaces of the substrate located between the fins, and deposition of a first WFM layer on an upper surface of the dielectric layer.
Figure 4:
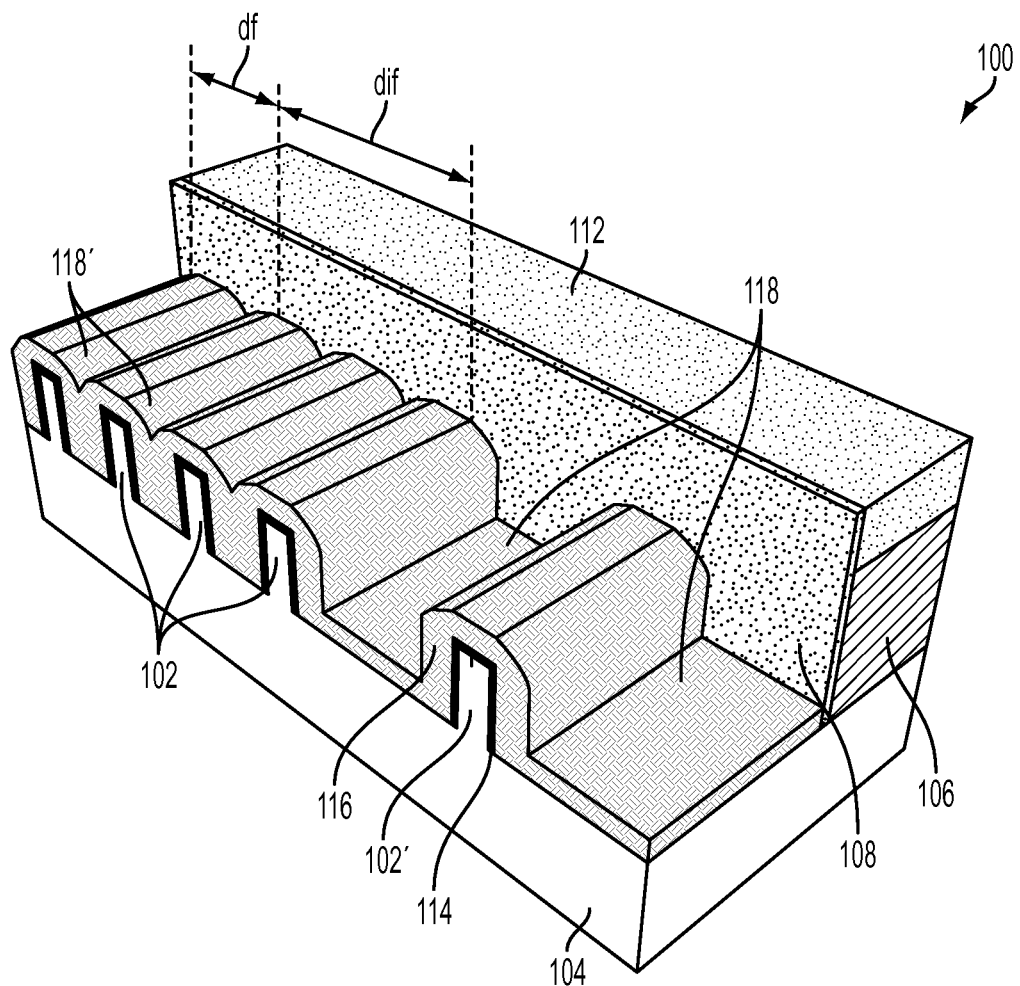
FIG. 4 illustrates the semiconductor device of FIG. 3 according to the second orientation.

Turning now to FIGS. 3 and 4, a conformal dielectric layer 114 and a conformal first work function metal (WFM) layer 116 are formed on the semiconductor fins 102/102'. More specifically, the conformal dielectric layer 114 is formed on the surface of the semiconductor fins 102/102' and on the surface of the semiconductor substrate 104 located between each fin 102/102'. The dielectric layer 114 may be formed from a high-dielectric (high-k) material including, but not limited to, hafnium oxide ($HfO_2$). The conformal dielectric layer 114 may have a thickness ranging from approximately 3 nanometers (nm) to approximately 5 nm.

The conformal first WFM layer 116 is formed on the dielectric layer 114. According to at least one embodiment, the first WFM layer 116 is formed directly on the surface of the dielectric layer 114. The first WFM layer 116 may be formed from various materials including, but not limited to, titanium nitride (TiN). The first WFM layer 116 may have a thickness ranging from approximately 3 nm to approximately 10 nm. According to at least one exemplary embodiment, the first WFM layer 116 has a thickness such that the first WFM layer 116 essentially fills a trench separating each of the semiconductor fins 102, while partially filling a trench separating the isolated semiconductor fin 102' from the remaining semiconductor fins 102. In this regard, a cavity 118 still exists between the isolated semiconductor fin 102' from the remaining semiconductor fins 102 as further illustrated in FIG. 4. According to at least one exemplary embodiment, a deep cavity 118 may be formed between the isolated semiconductor fin 102' and the remaining semiconductor fins 102 while a plurality of shallow cavities deep cavity 118' are formed between the remaining semiconductor fins 102. The deep cavity 118 may extend from the upper surface of the first WFM layer 116 to the base of the first WFM layer 116 formed on the dielectric layer 114. The shallow cavities 118', however, may be formed near the upper surface of the first WFM layer 116 without extending to the base of the first WFM layer 116 as further illustrated in FIG. 4.

Figure 5:
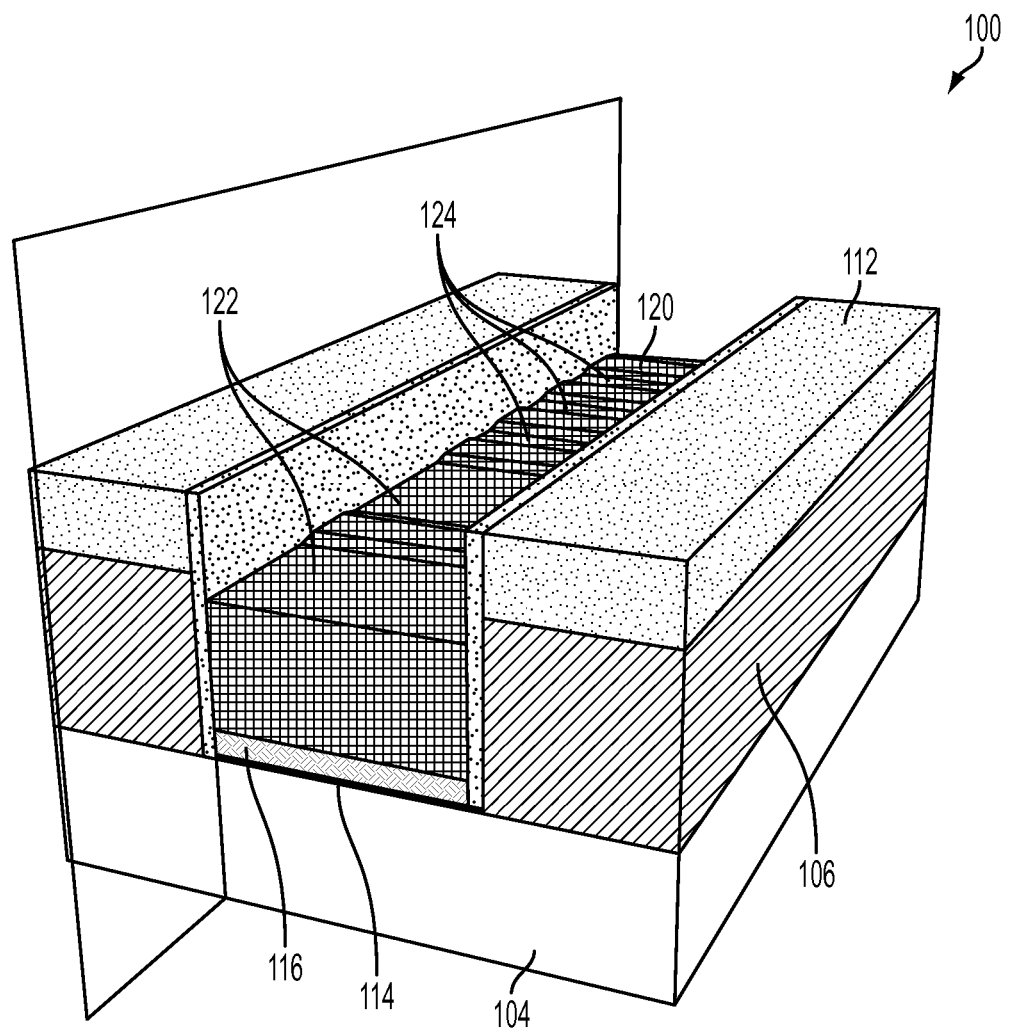
FIG. 5 illustrates the semiconductor device of FIGS. 3 and 4 according to the first orientation following deposition of a second WFM layer on an upper surface the first WFM layer.
Figure 6:
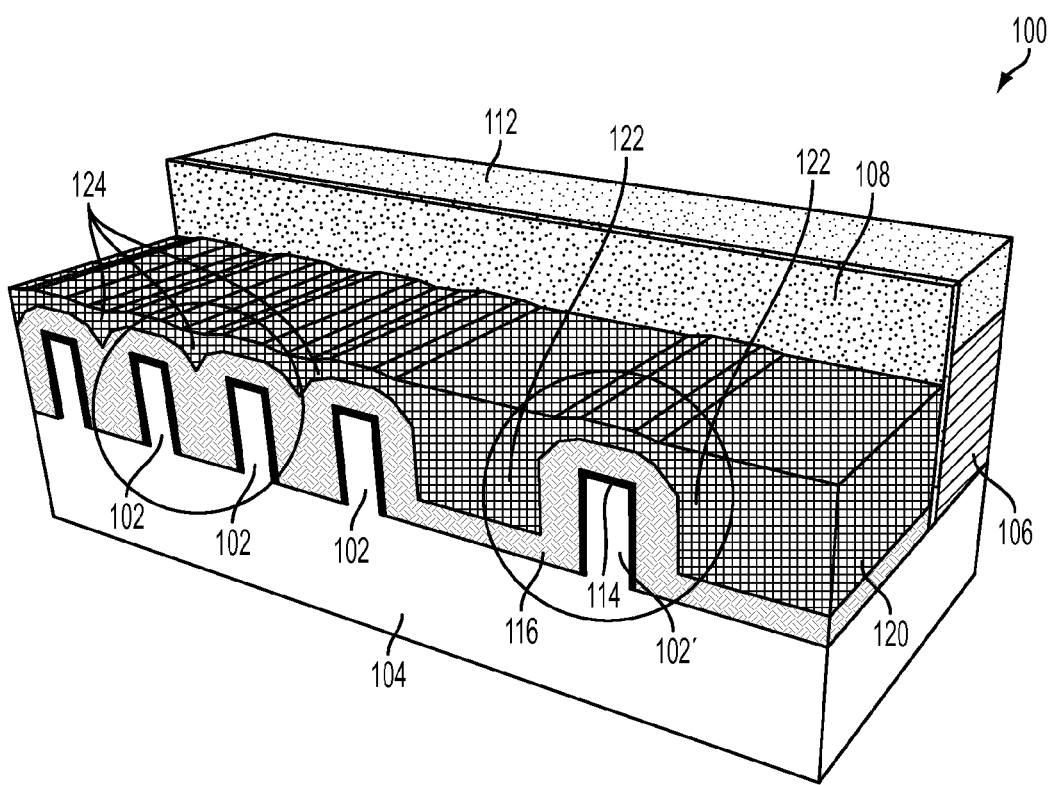
FIG. 6 illustrates the semiconductor device of FIG. 5 according to the second orientation.

Turning now to FIGS. 5 and 6, a second WFM layer 120 is formed on the first WFM layer 116 to fill the deep and shallow cavities 118/118', respectively. The first WFM layer 116 is therefore interposed between the second WFM layer 120 and the dielectric layer 114. The second WFM layer 120 may be formed from a material that is different from the material used to form the first WFM layer 116. For example, the second WFM layer 120 may be formed from metal material including, but not limited to, titanium carbide (TiC).

Due to the differences in depths between the deep cavities 118 and the shallow cavities 118', a first portion 122 of the second WFM layer 120 surrounding the isolated semiconductor fin 102' has a thickness ($d_{WFM1}$) that is different than a thickness ($d_{WFM2}$) of second portion 124 of the second WFM layer 120 surrounding the remaining semiconductor fins 102. That is, the pitch variation between the isolated semiconductor fin 102' and the remaining semiconductor fins 102 generates a thickness differential ($\Delta d_{WFM}$) with respect to the first portion 122 of the second WFM layer 120 the second portion 124 of the second WFM 120. The thickness differential ($\Delta d_{WFM}$) of the second WFM layer 120 provides a variation in the threshold voltage (Vt) between one or more isolated semiconductor fins 102' and one or more of the remaining semiconductor fins 102.

Still referring to FIGS. 5 and 6, the amount of the second WFM layer 120 surrounding one or more of the semiconductor fins 102 is less than the amount of the first WFM layer 116. In this regard, the threshold voltage (Vt) of the semiconductor fins is essentially tuned according to the first WFM layer 116. However, the amount of the second WFM layer 120 surrounding one or more of the isolated fins 102' may be significantly greater than the amount of the first WFM layer 116. Accordingly, the threshold voltage (Vt) of the isolated semiconductor fins 102 is essentially tuned according to the second WFM layer 120. In another embodiment, the threshold voltage of the isolated semiconductor fins 102' is tuned according to a combination of the first WFM layer 116 and the second WFM layer 120. Therefore, a threshold voltage (Vt) of one or more isolated semiconductor fins 102 may be tuned differently from the threshold voltage (Vt) of one or more of the remaining fins 102'. That is, a threshold voltage differential ($\Delta Vt$) may be generated based on thickness of the first and second WFM layers 118/116 surrounding a respective semiconductor fin 102/102'.

Further, at least one exemplary embodiment may allow for achieving different threshold voltages (Vt) using essentially only a single WFM layer. By forming deep cavities 118 that surround one or more of the isolated semiconductor fins 102', a first threshold voltage ($Vt_1$) may be based essentially on only the second WFM layer. By forming shallow cavities 118' that surround one or more of the remaining semiconductor fins 102, a second threshold voltage ($Vt_2$) may be based essentially on only the first WFM layer 116. Therefore, different threshold voltages may be generated using only a single WFM layer, instead of using an excessive number of WFM layers. As a result, the number of WFM layer formation process incorporated in the fabrication of the semiconductor device may be reduced.

Figure 7:
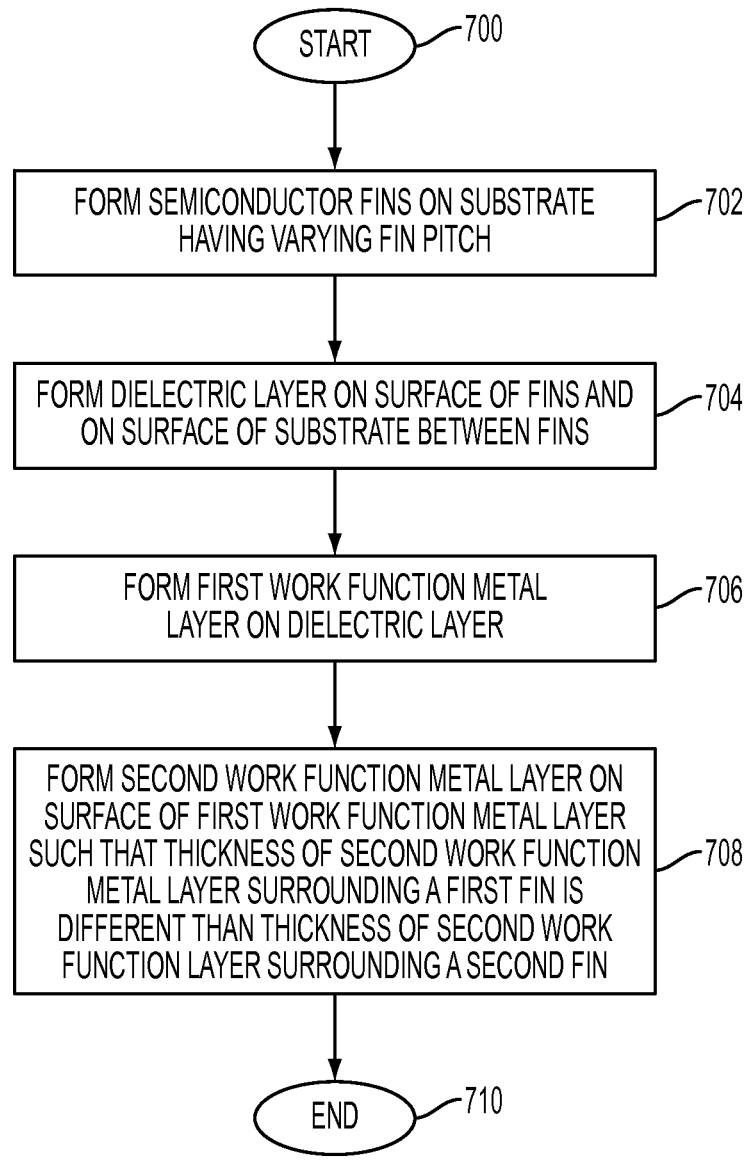
FIG. 7 is a flow diagram illustrating a method of fabricating a semiconductor device according to an exemplary embodiment.

Referring to FIG. 7, a flow diagram illustrates a method of fabricating a semiconductor device according to an exemplary embodiment. The method begins at operation 700, and proceeds to operation 702 where a plurality of semiconductor fins having a varying fin pitch is formed on semiconductor substrate. Various methods for forming the semiconductor fins may be used as understood by those ordinarily skilled in the art. At operation 704, a dielectric layer is formed on the surface of the semiconductor fins and on the surface of the substrate located between each fin. The dielectric layer may be formed from a high-dielectric (high-k) material including, but not limited to, hafnium oxide ($HfO_2$). At operation 706, a first WFM layer is formed on the dielectric layer. According to at least one embodiment, the first WFM layer is formed directly on the surface of the dielectric layer. The first WFM layer may be formed from various materials including, but not limited to, titanium nitride (TiN). At operation 708, a second WFM layer is formed on the first WFM layer such that a first portion of the second WFM layer surrounding a first semiconductor fin has a thickness that is different than a second portion of the second WFM layer surrounding a second semiconductor fin. According to at least one embodiment, the second WFM layer may be formed directly on the first WFM layer. The second WFM layer may be formed from a material that is different from the first WFM. For example, the second WFM layer may be formed from metal material including, but not limited to, titanium carbide (TiC). The method ends at operation 710 such that a semiconductor device including a first fin pitch corresponding to the first fin provides a first threshold voltage while a second fin pitch corresponding to the second fin provides a second threshold voltage different from the first threshold voltage.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated The flow diagrams depicted herein are just one example. There may be many variations to this diagram or the operations described therein without departing from the spirit of the invention. For instance, the operations may be performed in a differing order or operations may be added, deleted or modified. All of these variations are considered a part of the claimed invention.

While various embodiments have been described, it will be understood that those skilled in the art, both now and in the future, may make various modifications which fall within the scope of the claims which follow. These claims should be construed to maintain the proper protection for the invention first described.

What is claimed is:

1. A semiconductor device, comprising:
   a plurality of first semiconductor fins formed on a semiconductor substrate and separated from one another according to a first fin pitch to define corresponding first fin trenches having a first width;
   at least one second semiconductor fin formed on the semiconductor substrate and separated from the plurality of first semiconductor fins by a second fin pitch to define corresponding second fin trenches having a second width that is different than the first width; and
   a first work function metal layer formed in the first and second fin trenches, the first work function metal layer formed in the second trenches having a first cavity formed therein such that the at least one second semiconductor fin realizes a different concentration of the first work function metal layer with respect to the plurality of first semiconductor fins.

2. The semiconductor device of claim 1, wherein the first work function metal layer has a second cavity formed in at least one of the first fin trenches.

3. The semiconductor device of claim 2, wherein second fin trenches have a second width that is greater than the first width such that the first cavity extends a first depth and the second cavity extends a second depth that is less than the first depth.

4. The semiconductor device of claim 3, further comprising a second work function metal layer that is formed on the first work function metal layer and that fills the first and second cavities.

5. The semiconductor device of claim 4, wherein an amount of the second work function metal layer surrounding the at least one second semiconductor fin is greater than an amount of the second work function metal layer surrounding at least one semiconductor fin among the plurality of first semiconductor fins.

6. The semiconductor device of claim 5, wherein a combination of the first and second work function metal layers surrounding the plurality of first semiconductor fins defines a first threshold voltage and a combination of the first and second work function metal layers surrounding the at least one second semiconductor fin defines a second threshold voltage different from the first threshold voltage.

7. The semiconductor device of claim 6, wherein the first work function metal layer is formed from titanium nitride (TiN) and the second work function metal layer is formed from titanium carbide (TiC).

8. The semiconductor device of claim 7, wherein an oxide layer is interposed between each semiconductor fin and the first work function metal layer.

9. A semiconductor device, comprising:
   a plurality of first semiconductor fins formed on a semiconductor substrate and separated from one another by first fin trenches having a first width;
   at least one second semiconductor fin formed on the semiconductor substrate and separated from the plurality of first semiconductor fins by a second fin trench having a second width that is greater than the first width;
   a first work function metal layer formed in the first and second fin trenches; and
   a second work function metal layer formed on the first work function metal layer such that a first combination of first and second work function metal layers surrounding the plurality of first semiconductor fins defines a first threshold voltage and a second combination between the first and second work function metal layers surrounding the at least one second semiconductor fin defines a second threshold voltage different than the first threshold voltage.

10. The semiconductor device of claim 9, wherein the first combination defines a first thickness differential between first and second work function metal layers and the second combination defines a second thickness differential between first and second work function metal layers that is different than the first thickness differential.

11. The semiconductor device of claim 10, wherein the thickness of the second work function metal surrounding the at least one second semiconductor fin is greater than the thickness of the first work function metal surrounding the at least one second semiconductor fin.

12. The semiconductor device of claim 11, wherein the thickness of the first work function metal surrounding at least one fin among the plurality of first semiconductor fins is greater than the thickness of the second work function metal surrounding the at least one fin.

13. The semiconductor device of claim 12, wherein each fin among plurality of first semiconductor fins is separated from one another according to a first fin pitch, and wherein the at least one second semiconductor fin is separated from plurality of first semiconductor fins according to a second fin pitch that is different from the first fin pitch.

14. The semiconductor device of claim 13, wherein the first work function metal layer is formed from titanium nitride (TiN) and the second work function metal layer is formed from titanium carbide (TiC).

15. The semiconductor device of 14, wherein an oxide layer is interposed between each semiconductor fin and the first work function metal layer.

16. A method of fabricating a semiconductor device, the method comprising:
   forming a plurality of first semiconductor fins on a semiconductor substrate, the first semiconductor fins separated from one another according to a first fin pitch that defines corresponding first fin trenches having a first width;
   forming at least one second semiconductor fin formed on the semiconductor substrate, the at least one second semiconductor fin separated from the plurality of first semiconductor fins according to a second fin pitch that defines corresponding second fin trenches having a second width that is different from the first width; and
   forming a first work function metal layer in the first and second fin trenches, the first work function metal layer formed in the second trenches having a first cavity formed therein such that the at least one second semiconductor fin realizes a different concentration of the first work function metal layer with respect to the plurality of first semiconductor fins.

17. The semiconductor device of claim 16, wherein the forming a first work function metal layer includes forming a second cavity in at least one of the first fin trenches.

18. The semiconductor device of claim 17, wherein the forming a first work function metal layer includes extending the first cavity at a first depth and extending the second cavity a second depth that is less than the first depth.

19. The semiconductor device of claim 18, further comprising forming a second work function metal layer on the first work function metal layer such that the first and second cavities are filled.

20. The semiconductor device of claim 19, wherein the forming a second work function metal layer forms a first combination of the first and second work function metal layers surrounding the plurality of first semiconductor fins to define a first threshold voltage and forms a second combination of the first and second work function metal layers surrounding the at least one second semiconductor fin to define a second threshold voltage different from the first threshold voltage.

* * * * *